(12) United States Patent
Muto et al.

(10) Patent No.: US 10,530,244 B2
(45) Date of Patent: Jan. 7, 2020

(54) SWITCH CIRCUIT WITH ACTIVE SNUBBER CIRCUIT AND DC-DC CONVERTER

(71) Applicant: Murata Manufacturing Co., Ltd., Nagaokakyo-shi, Kyoto-fu (JP)

(72) Inventors: Takami Muto, Nagaokakyo (JP); Takayoshi Nishiyama, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 16/150,348

(22) Filed: Oct. 3, 2018

(65) Prior Publication Data

US 2019/0036445 A1   Jan. 31, 2019

Related U.S. Application Data

(63) Continuation of application No. PCT/JP2017/016475, filed on Apr. 26, 2017.

(30) Foreign Application Priority Data

May 17, 2016 (JP) ................................ 2016-098372

(51) Int. Cl.
*H02M 1/34* (2007.01)
*H03K 17/0814* (2006.01)
(Continued)

(52) U.S. Cl.
CPC ......... *H02M 1/34* (2013.01); *H02M 3/33592* (2013.01); *H03K 17/08142* (2013.01); *H03K 17/16* (2013.01); *H02M 2001/342* (2013.01)

(58) Field of Classification Search
CPC ...... H02M 1/08; H02M 1/34; H02M 3/33569; H02M 3/33592; H02M 2001/342; H03K 17/16; H03K 17/08142
(Continued)

(56) References Cited

U.S. PATENT DOCUMENTS 6,069,802 A * 5/2000 Priegnitz ................. H02M 1/34
                                                    323/907
6,771,521 B1   8/2004 Xiong et al.
(Continued)

FOREIGN PATENT DOCUMENTS

JP    58-164323 A    9/1983
JP    2001237093 A    8/2001
(Continued)

OTHER PUBLICATIONS

Official Communication issued in International Patent Application No. PCT/JP2017/016475, dated Jun. 27, 2017.
Official Communication issued in Japanese Patent Application No. 2018-518190, dated Jul. 23, 2019.

*Primary Examiner* — Nguyen Tran
*Assistant Examiner* — Monica Mata
(74) *Attorney, Agent, or Firm* — Keating & Bennett, LLP

(57) ABSTRACT

A switch circuit includes a first switch element defined by an FET, and an active snubber circuit connected between a drain and a source of the first switch element and including a second switch element defined by an FET, a capacitor connected in series to the second switch element, a third switch element connected to a gate of the second switch element and turned on to extract an electric charge of capacitance between the gate and a source of the second switch element, and a delay circuit that turns on the third switch element at a timing delayed from a timing at which the second switch element is turned on.

20 Claims, 12 Drawing Sheets

(51) Int. Cl.
 *H03K 17/16* (2006.01)
 *H02M 3/335* (2006.01)

(58) Field of Classification Search
 USPC .......................................................... 363/53
 See application file for complete search history.

(56) References Cited

U.S. PATENT DOCUMENTS

| | | | |
|---|---|---|---|
| 6,822,882 B1 | 11/2004 | Jacobs et al. | |
| 2003/0142521 A1 | 7/2003 | Hosotani et al. | |
| 2005/0285661 A1* | 12/2005 | Wittenbreder, Jr. | H02M 1/08 |
| | | | 327/434 |
| 2011/0018512 A1 | 1/2011 | Horii | |

FOREIGN PATENT DOCUMENTS

| | | |
|---|---|---|
| JP | 2002044946 A | 2/2002 |
| JP | 2003224972 A | 8/2003 |
| JP | 2009273230 A | 11/2009 |

\* cited by examiner

SWITCH CIRCUIT WITH ACTIVE SNUBBER CIRCUIT AND DC-DC CONVERTER

CROSS REFERENCE TO RELATED APPLICATIONS

This application claims the benefit of priority to Japanese Patent Application No. 2016-098372 filed on May 17, 2016 and is a Continuation Application of PCT Application No. PCT/JP2017/016475 filed on Apr. 26, 2017. The entire contents of each application are hereby incorporated herein by reference.

BACKGROUND OF THE INVENTION

1. Field of the Invention

The present invention relates to a switch circuit including a snubber circuit which is switched in synchronization with a switch element, and a DC-DC converter including the switch circuit.

2. Description of the Related Art

U.S. Pat. No. 6,771,521 discloses a DC-DC converter in which an active snubber circuit is connected to a commutation switch element of a synchronous rectifier circuit.

FIG. 12 is a circuit diagram of a main portion of the DC-DC converter including the active snubber circuit disclosed in U.S. Pat. No. 6,771,521.

In FIG. 12, an ON signal is input from a transformer T between a gate and a source of a snubber switch element Sa at a timing at which a commutation switch element S1 is turned off. With this, the snubber switch element Sa is changed into an ON state, and a voltage of the commutation switch element S1 is clamped to a voltage of a snubber capacitor Ca1. A voltage between the gate and the source of the snubber switch element Sa is extracted by a resistor Rx even during a period in which the snubber switch element Sa is turned on, and the snubber switch element Sa is turned off before the commutation switch element S1 is turned on.

In the active snubber circuit disclosed in U.S. Pat. No. 6,771,521, since a gate voltage (charged electric charges of capacitance between the gate and the source) of the snubber switch element Sa is consumed by the resistor Rx and is lost, power conversion efficiency of the DC-DC converter is deteriorated due to this loss. Further, it is necessary to use a resistor capable of withstanding the above loss for the resistor Rx, which leads to an increase in size and cost. In addition, the ON-period of the snubber switch element Sa is determined by a time constant of parasitic capacitance (the capacitance between the gate and the source) of the snubber switch element Sa and the resistor Rx. Therefore, when a large voltage is applied between the gate and the source of the snubber switch element Sa, the commutation switch element S1 is turned on before the snubber switch element Sa is turned off. In this situation, the electric charges of the snubber capacitor Ca1 are discharged through the commutation switch element S1 and the snubber switch element Sa. That is, a through-current flows. This through-current is a current which does not contribute to the power conversion, and thus leads to an increase in the loss.

SUMMARY OF THE INVENTION

Preferred embodiments of the present invention provide switch circuits each including an active snubber circuit and a DC-DC converter including the same, in which a conduction period of a switch element for the active snubber circuit is improved or optimized, and a problem of a loss in an electric charge extraction of the switch element for the active snubber circuit and a problem of the through-current of the snubber circuit are solved.

A switch circuit that includes an active snubber circuit according to a preferred embodiment of the present invention includes a first switch element defined by an FET; and an active snubber circuit connected between a drain and a source of the first switch element, in which the active snubber circuit includes a second switch element defined by an FET, a capacitor connected in series to the second switch element, a third switch element connected to a gate of the second switch element and being turned on to extract an electric charge of capacitance between the gate and a source of the second switch element, and a delay circuit which turns on the third switch element at a timing that is delayed from a timing at which the second switch element is turned on.

According to the above-described configuration, the charged electric charges of the capacitance between the gate and the source of the second switch element for the snubber are not wastefully consumed by a resistor. Further, even if a large voltage is applied between the gate and the source of the second switch element for the snubber, the ON time of the second switch element is determined by the delay circuit which is turned on. Therefore, it is possible to prevent the through-current circulating through the first switch element to be protected and the second switch element for the snubber.

In a switch circuit according to a preferred embodiment of the present invention, the delay circuit includes a time constant circuit that determines a control terminal voltage of the third switch element, and is connected to a control terminal of the third switch element. With this structure, the delay circuit is able to be a simple circuit.

In a switch circuit according to a preferred embodiment of the present invention, the third switch element is defined by an FET, and the time constant circuit includes an internal parasitic capacitance between a gate and a source of the third switch element and a resistance component of a conductor pattern connected to the gate of the third switch element. With this structure, the switch circuit with the active snubber circuit with a low cost and a small area is able to be provided.

In a switch circuit according to a preferred embodiment of the present invention, the delay circuit may be a circuit including a comparator which compares an output voltage of the time constant circuit with a reference voltage and drives the third switch element. With this configuration, a delay time is able to be set with high accuracy.

A DC-DC converter according to a preferred embodiment of the present invention includes a voltage input section that receives a DC voltage; a voltage output section to which a load is connected; a transformer including at least a primary winding and a secondary winding; a main switch element provided between the voltage input section and the primary winding of the transformer; and a synchronous rectifier circuit including an active snubber circuit and provided between the voltage output section and the secondary winding of the transformer, in which the active snubber circuit includes a second switch element defined by an FET, a capacitor connected in series to the second switch element, a third switch element connected to a gate of the second switch element and being turned on to extract an electric charge of capacitance between the gate and a source of the second switch element, and a delay circuit which turns on the third switch element at a timing delayed from a timing at which the second switch element is turned on.

With the configuration described above, in the active snubber circuit provided in the synchronous rectifier circuit, the charged electric charges of the capacitance between the gate and the source of the second switch element for the snubber are not wastefully consumed by the resistor, and even if a large voltage is applied between the gate and the source of the second switch element for the snubber, the ON time of the second switch element is determined by the delay circuit which is turned on. Therefore, the through-current is prevented.

In a DC-DC converter according to a preferred embodiment of the present invention, the transformer includes an auxiliary winding, and a voltage of the auxiliary winding of the transformer is input to the delay circuit and the third switch element is turned off. With this structure, it is possible to simplify a configuration of the circuit that drives the second switch element including the third switch element and the delay circuit.

According to preferred embodiments of the present invention, charged electric charges in an active snubber circuit are not wastefully consumed, it is possible to prevent a through-current circulating through a first switch element to be protected and a second switch element for a snubber, and thus a power loss is reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
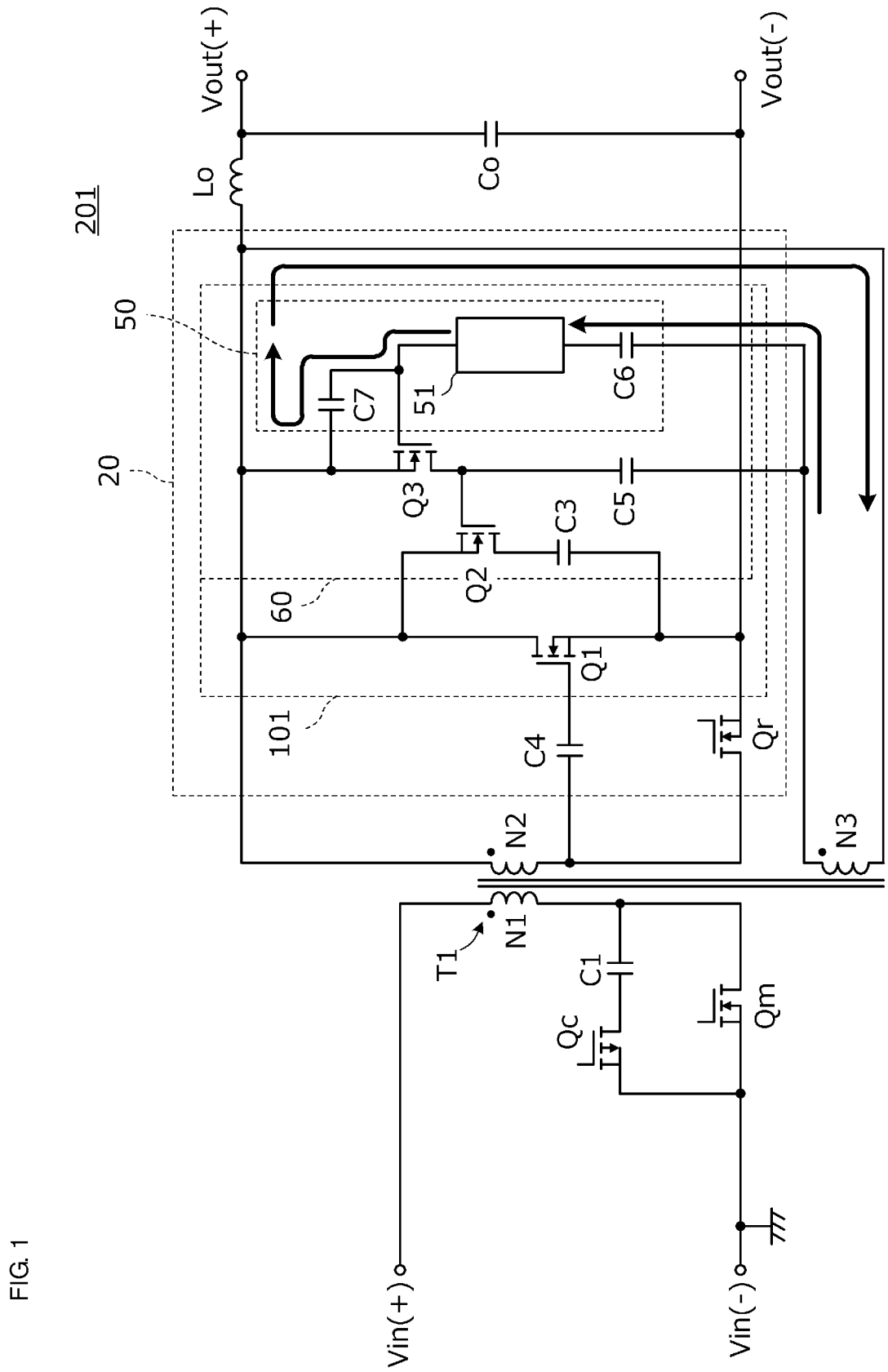
FIG. 1 is a circuit diagram of a DC-DC converter 201 according to a first preferred embodiment of the present invention.

Preferred embodiments of the present invention will be described hereinafter with reference to the drawings, using several specific examples. Corresponding elements in the drawings are denoted by the same reference numerals. Although, the preferred embodiments are separately described for convenience, configurations described in different preferred embodiments may partially replace each other or be combined. In second and subsequent preferred embodiments, description of common points to those in a first preferred embodiment will be omitted, and only different points will be described. In particular, the same advantageous actions and effects achieved by the same configurations are not described for each preferred embodiment.

First Preferred Embodiment

FIG. 1 is a circuit diagram of a DC-DC converter 201 according to a first preferred embodiment of the present invention. The DC-DC converter 201 includes voltage input sections Vin(+) and Vin(−) that receive a DC voltage, and voltage output sections Vout(+) and Vout(−) to which a load is connected, converts the DC voltage input to the voltage input sections Vin(+) and Vin(−) into a stabilized predetermined DC voltage, and outputs the resulting DC voltage to the load through the voltage output sections Vout(+) and Vout(−). The DC-DC converter 201 includes a transformer T1 including a primary winding N1, a secondary winding N2, and an auxiliary winding N3. A main switch element Qm is connected between the voltage input sections Vin(+) and Vin(−) and the primary winding N1 of the transformer T1. A rectifier circuit 20 is provided between the voltage output sections Vout(+) and Vout(−) and the secondary winding N2 of the transformer T1.

The main switch element Qm is preferably an FET, for example, and a series circuit of a clamp switch element Qc and a clamp capacitor C1 is connected in parallel between a drain and a source of the main switch element Qm. That is, the series circuit including the clamp switch element Qc and the capacitor C1 defines a clamp circuit.

A primary side control circuit is connected to the gate and the source of the main switch element Qm and the clamp switch element Qc, and a gate signal is supplied thereto from the primary side control circuit. The clamp switch element Qc and the main switch element Qm operate inversely to each other by the gate signal supplied from the primary side control circuit.

A rectifier switch element Qr and an inductor (choke coil) Lo are connected in series to the secondary winding N2 of the transformer T1. A first switch element Q1 is a commutation switch element and is connected between a connection point of the secondary winding N2 and the inductor Lo and a Vout(−) terminal. The rectifier circuit 20 includes the rectifier switch element Qr and the first switch element Q1. An output capacitor Co is connected between ends of the voltage output sections Vout(+) and Vout(−).

A secondary side control circuit is connected to a gate and a source of the rectifier switch element Qr, and the rectifier switch element Qr is turned on/off synchronously with the on/off of the main switch element Qm by the secondary side control circuit. The secondary side control circuit generates a gate signal for the rectifier switch element Qr based on, for example, a voltage of the auxiliary winding of the transformer T1.

A capacitor C4 is connected between a connection point between the secondary winding N2 of the transformer T1 and the rectifier switch element Qr and a gate of the first switch element Q1 which is the commutation switch element. When the rectifier switch element Qr is turned off, a voltage generated between a drain and the source of the rectifier switch element Qr (a counter electromotive voltage of the secondary winding N2) is applied between the gate and a source of the first switch element Q1 with the capacitor C4 interposed therebetween. Accordingly, the first switch element Q1 operates inversely to the rectifier switch element Qr.

Between a drain and the source of the first switch element Q1, a series circuit including a second switch element Q2 and a capacitor C3 for a snubber is connected. Further, a third switch element Q3 is connected between a gate and a source of the second switch element Q2.

A series circuit including a capacitor C6, a capacitor C7, and an impedance circuit 51 is connected between both ends of the auxiliary winding N3 of the transformer T1. Further, a series circuit of the third switch element Q3 and a capacitor C5 is connected between both ends of the auxiliary winding N3, and a connection point between the third switch element Q3 and the capacitor C5 is connected to the gate of the second switch element Q2.

The delay circuit 50 is defined by a series circuit including the capacitor C7, the impedance circuit 51, and the capacitor C6. The impedance circuit 51 is preferably, for example, a resistive element. In this case, the delay circuit 50 is a CR time constant circuit.

The second switch element Q2, the capacitor C3, the third switch element Q3, the capacitor C5, and the delay circuit 50 define an active snubber circuit 60. Additionally, the active snubber circuit 60 and the first switch element Q1 define a switch circuit 101 including the active snubber circuit.

The main switch element Qm, the transformer T1, the rectifier circuit 20, the inductor Lo, and the output capacitor Co define a forward DC-DC converter circuit. Further, by providing a clamp circuit by the clamp switch element Qc and the clamp capacitor C1, the DC-DC converter 201 operates as a forward converter including an active clamp circuit at the main switch element Qm on the primary side and the active snubber circuit at the first switch element (commutation switch element) Q1 on the secondary side.

Since the rectifier switch element Qr and the main switch element Qm are synchronously turned on/off and the first switch element Q1 which is the commutation switch element operates inversely to the rectifier switch element Qr, the DC-DC converter 201 operates as a forward converter.

The detailed operations of the DC-DC converter 201, particularly the active snubber circuit, are as follows.

(1) When the main switch element Qm is turned on by the control of the primary side control circuit, the rectifier switch element Qr is turned on by the control of the secondary side control circuit. With this, the voltage between the gate and the source of the first switch element Q1 drops below a threshold voltage of the first switch element Q1, and the first switch element Q1 is turned off.

(2) When the main switch element Qm is turned off by the control of the primary side control circuit, the rectifier switch element Qr is turned off by the control of the secondary side control circuit. When the rectifier switch element Qr is turned off, a counter electromotive voltage of the secondary winding N2 of the transformer T1 appears at both ends of the rectifier switch element Qr. Since this voltage is applied between the gate and the source of the first switch element Q1 with the capacitor C4 interposed therebetween, the first switch element Q1 is turned on. With this, a current of the inductor Lo is commutated through the first switch element Q1.

Thereafter, the state returns to the above-described state (1) again. In state (1), a voltage generated in the auxiliary winding N3 of the transformer T1 is applied between the gate and the source of the second switch element Q2 with the capacitor C5 interposed therebetween, and the second switch element Q2 is turned on. With this, the second switch element Q2 and the capacitor C3 act as the snubber circuit for the first switch element Q1.

Further, due to the voltage generated in the auxiliary winding N3 of the transformer T1, a current flows in the delay circuit 50 in a direction indicated by an arrow in FIG. 1. After a delay time by the delay circuit 50 has elapsed, the third switch element Q3 is changed into an ON state, and with this operation, the second switch element Q2 is forcibly turned off. Specifically, immediately after the voltage of the auxiliary winding N3 is applied to the delay circuit 50, a voltage of the capacitor C7 (voltage between a gate and a source of the third switch element Q3) is lower than a threshold voltage of the third switch element Q3, and the third switch element Q3 is in an OFF state. Thereafter, when a charging voltage of the capacitor C7 exceeds the threshold voltage of the third switch element Q3, the third switch element Q3 is turned on. With this, a voltage between the gate and the source of the second switch element Q2 drops below a threshold voltage of the second switch element Q2, and the second switch element Q2 is turned off. In this manner, the second switch element Q2 is forcibly turned off after the delay time by the delay circuit 50 has elapsed.

Figure 2:
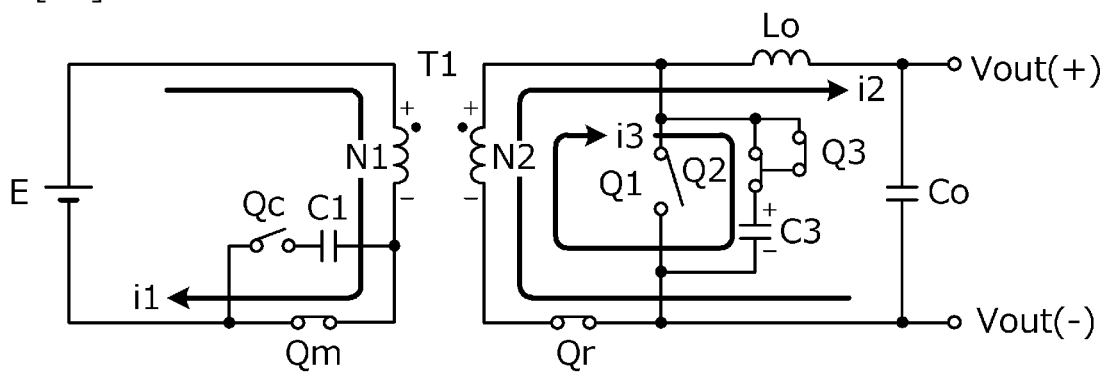
FIG. 2 is a simplified circuit diagram of the DC-DC converter 201.
Figure 2:
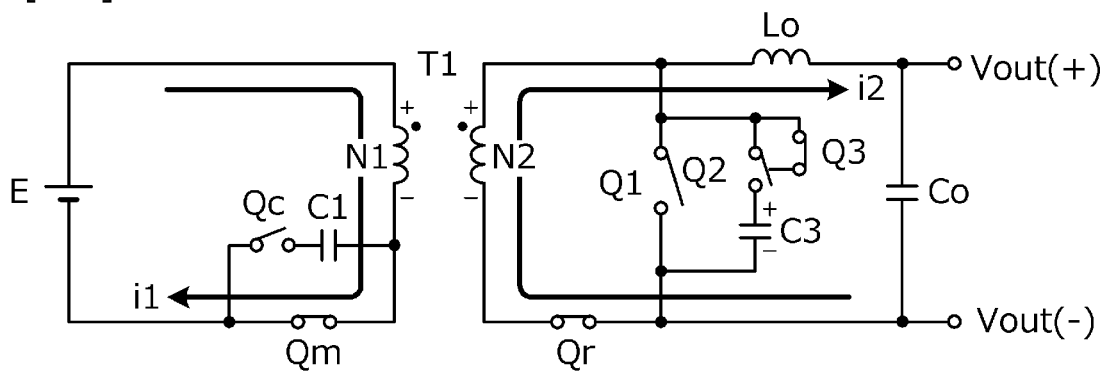
Figure 2:
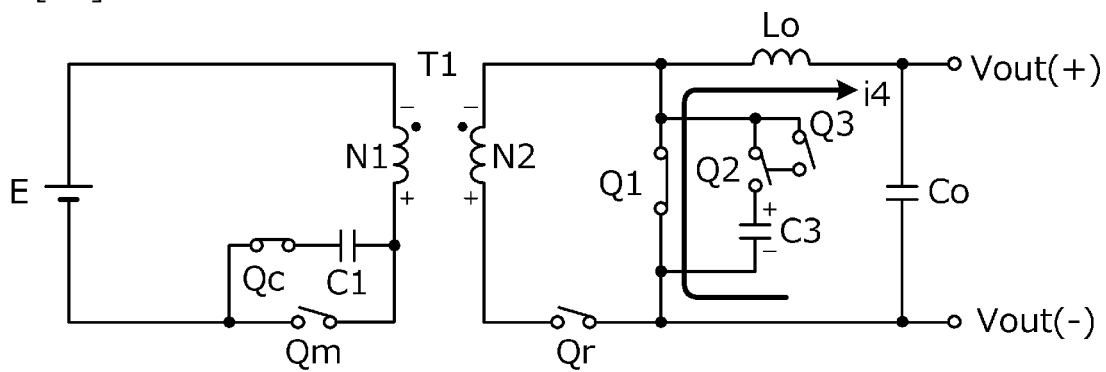
Figure 3:
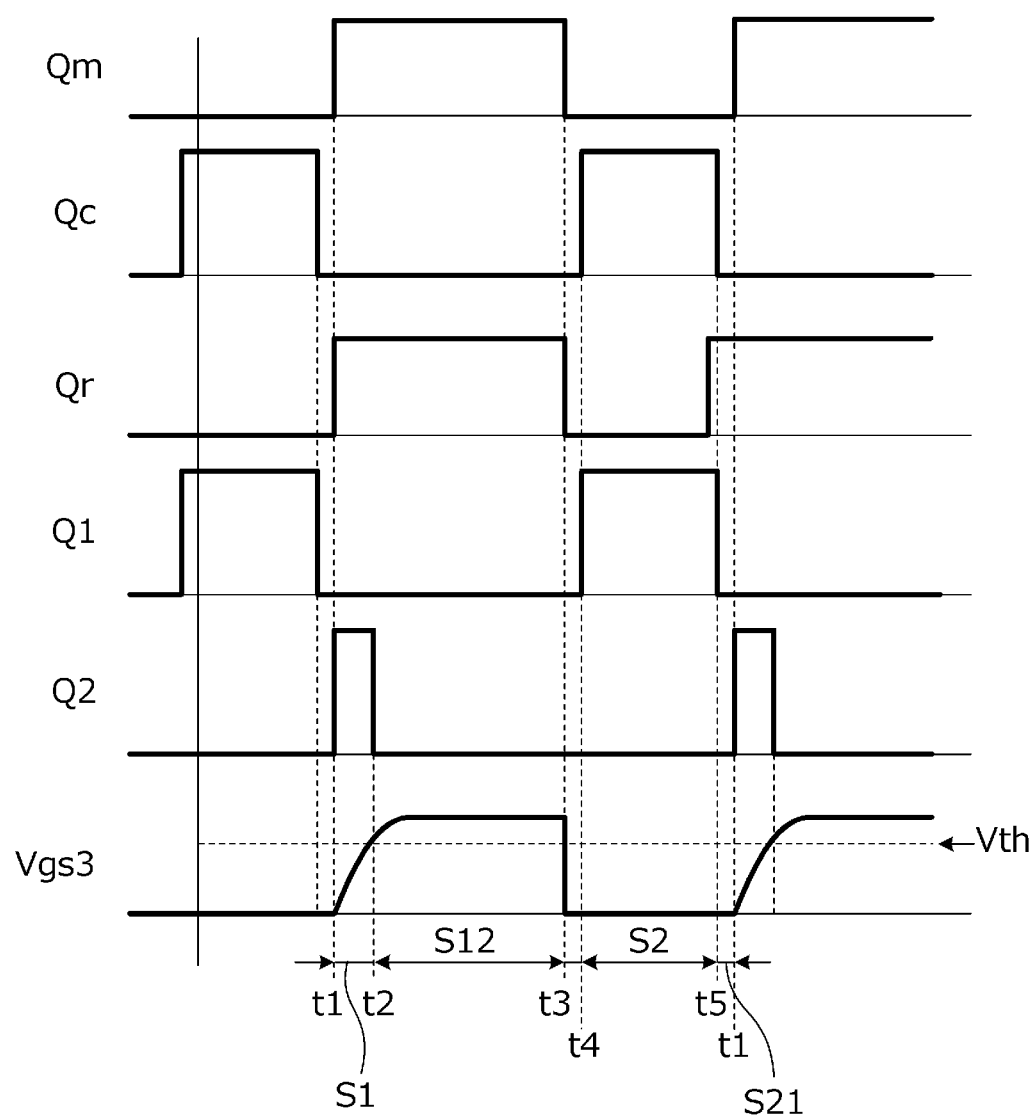
FIG. 3 is a timing chart illustrating a state of each switch element of the DC-DC converter 201.

Next, a state transition of each switch element of the DC-DC converter 201 illustrated in FIG. 1 will be described with reference to a simplified circuit diagram and a timing chart. FIG. 2 is a simplified circuit diagram of the DC-DC converter 201 and FIG. 3 is a timing chart illustrating a gate voltage of each switch element. A voltage Vgs3 in FIG. 3 is the voltage between the gate and the source of the third switch element Q3, and a voltage Vth is the threshold voltage thereof.

As illustrated in FIG. 3, the main switch element Qm and the rectifier switch element Qr are turned on at a time t1 and turned off at a time t3. Further, the clamp switch element Qc and the first switch element Q1 for the commutation are turned on at a time t4 and turned off at a time t5. The second switch element Q2 is turned on at the time t1 and turned off at a time t2.

A state S1, a state S12, and a state S2 illustrated in FIG. 2 correspond to a period S1, a period S12, and a period S2 in FIG. 3, respectively.

As illustrated in the state S1 of FIG. 2, when the main switch element Qm is in an ON state and the rectifier switch element Qr is in an ON state, a current i1 flows through the primary winding N1 of the transformer T1, and a current i2 flows through the secondary winding N2 and the inductor Lo. Further, at this time, since the second switch element Q2 is in an ON state, a surge voltage generated at the first switch element Q1 is absorbed by the snubber capacitor C3.

Thereafter, as in the state S12 illustrated in FIG. 2, by the second switch element Q2 being turned off with the third switch element Q3 being turned on, the snubber capacitor C3 is changed into a state disconnected from the first switch element Q1.

Thereafter, the state is changed to the state S2, and the first switch element Q1 is turned on. At this time, since the second switch element Q2 has already been turned off, there is no discharge from the capacitor C3, and no short-circuit current flows through the first switch element Q1.

Note that since the third switch element Q3 is the switch element, a loss due to the third switch element Q3 is also able to be reduced or prevented.

As illustrated in the state S2 of FIG. 2, when the main switch element Qm is in an OFF state and the clamp switch element Qc is in an ON state, a commutation current i4 flows through the first switch element Q1.

As illustrated in FIG. 3, the ON-period of the second switch element Q2 is determined by the threshold voltage of the third switch element Q3 and a time constant of the time constant circuit connected to the gate of the third switch element Q3.

Figure 4:
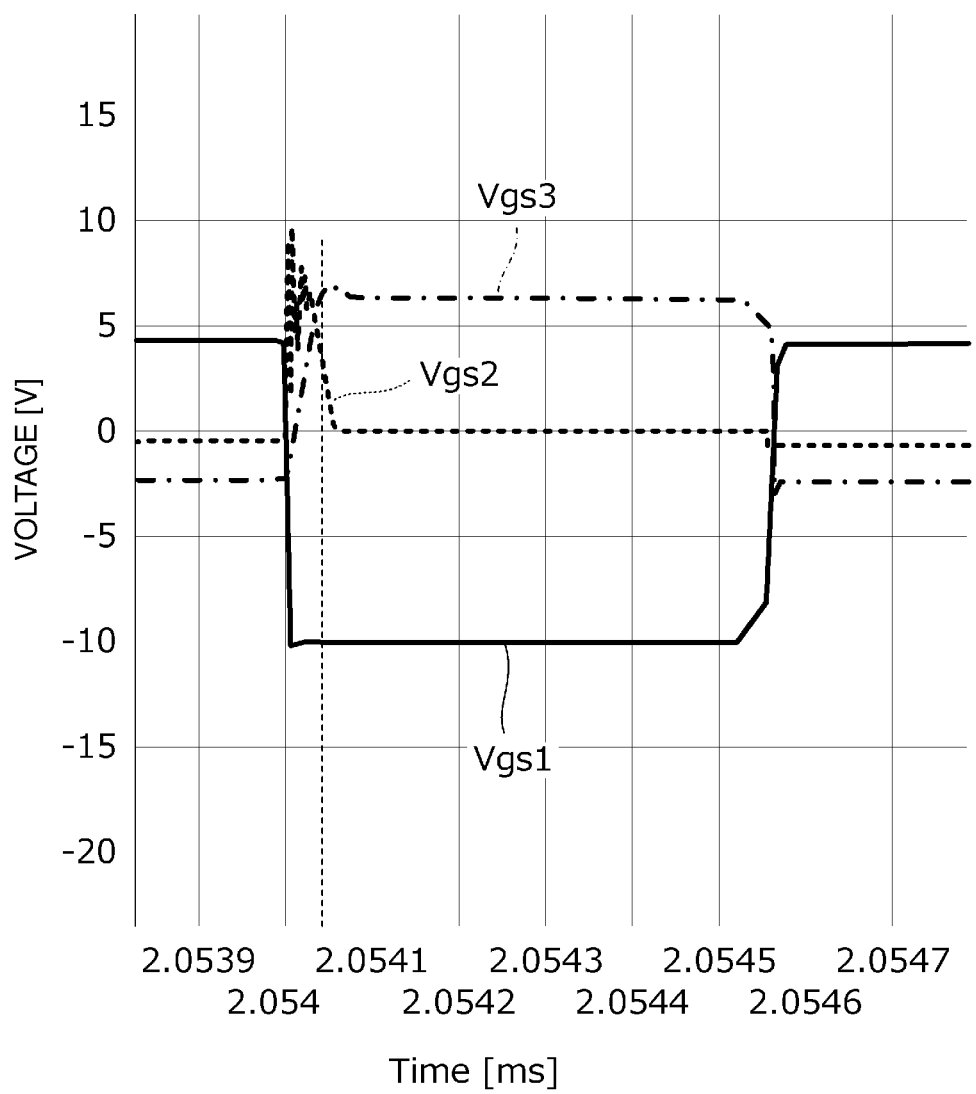
FIG. 4 is a diagram illustrating a voltage waveform of each section in FIG. 1.

FIG. 4 is a diagram illustrating a voltage waveform of each section in FIG. 1. Here, a voltage Vgs1 is the voltage between the gate and the source of the first switch element Q1, a voltage Vgs2 is the voltage between the gate and the source of the second switch element Q2, and the voltage Vgs3 is the voltage between the gate and the source of the third switch element Q3. In this example, the voltage between the gate and the source of the first switch element Q1 drops at a time of about 2.054 ms, for example, and the first switch element Q1 is turned off. At this timing, the voltage between the gate and the source of the second switch element Q2 exceeds the threshold value, and the second switch element Q2 is turned on. Thereafter, at a time of, for example, about 2.05404 ms after the lapse of the delay time of the delay circuit 50, the third switch element Q3 is turned on, and the electric charges of the capacitance between the gate and the source of the second switch element Q2 are extracted. With this, the second switch element Q2 is forcibly turned off.

Through the operation described above, a conduction period of the second switch element Q2 which is the snubber switch element is improved or optimized. With this, even when a large voltage is applied between the gate and the source of the second switch element Q2, a situation in which the first switch element Q1 is turned on before the second switch element Q2 is turned off does not occur, and the short-circuit current flowing from the capacitor C3 to the second switch element Q2 and the first switch element Q1 is prevented.

Additionally, as a result, the charged electric charges of the snubber capacitor C3 are not discharged wastefully, and a decrease in the power conversion efficiency with this does not occur.

Further, since the active snubber circuit is driven by the voltage generated at the auxiliary winding N3 of the transformer T1, a driver circuit that drives the switch element of the active snubber circuit is not required, and thus, a low cost configuration is achieved.

Second Preferred Embodiment

In a second preferred embodiment of the present invention, a switch circuit including an active snubber circuit having a different circuit configuration from that described in the first preferred embodiment will be described.

Figure 5:
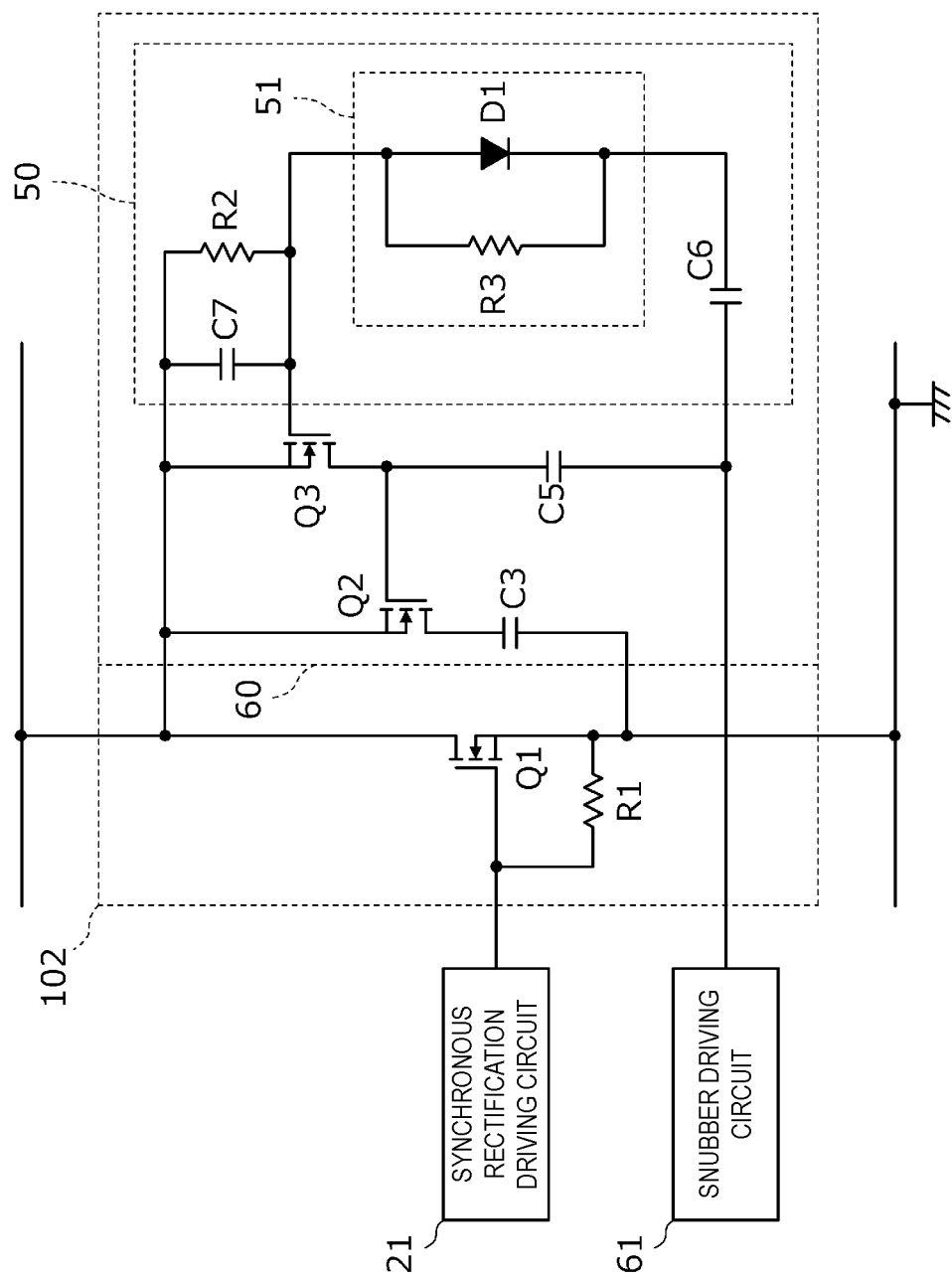
FIG. 5 is a circuit diagram of a switch circuit 102 including an active snubber circuit according to a second preferred embodiment of the present invention.

FIG. 5 is a circuit diagram of a switch circuit 102 including an active snubber circuit according to the second preferred embodiment. The switch circuit 102 including the active snubber circuit is also applied to, for example, the commutation switch element of the DC-DC converter.

A synchronous rectification driving circuit 21 is connected to the gate of the first switch element Q1 which is the commutation switch element. Between the drain and the source of the first switch element Q1, the series circuit including the second switch element Q2 and the capacitor C3 for the snubber is connected. Further, between the gate and the source of the first switch element Q1, a resistor R1 that discharges the charged electric charges between the gate and the source is connected.

A snubber driving circuit 61 is connected to the gate of the second switch element Q2. The third switch element Q3 is connected between the gate and the source of the second switch element Q2. The delay circuit 50 is connected to the gate of the third switch element Q3.

The delay circuit 50 is a time constant circuit including the capacitors C6 and C7 and a resistor R3. Of this delay circuit 50, the charging voltage of the capacitor C7 is applied between the gate and the source of the third switch element Q3. The resistor R3 and a diode D1 define the impedance circuit 51.

The second switch element Q2, the capacitor C3, the third switch element Q3, the capacitor C5, and the delay circuit 50 define the active snubber circuit 60.

In synchronization with the synchronous rectification driving circuit 21, the snubber driving circuit 61 outputs a predetermined positive voltage at a timing at which the second switch element Q2 for the snubber should be turned on. The output voltage of the snubber driving circuit 61 is applied between the gate and the source of the second switch element Q2, and the second switch element Q2 is turned on. With this, the second switch element Q2 and the capacitor C3 define and function as the snubber circuit for the first switch element Q1.

Further, by the output voltage of the snubber driving circuit 61 being applied to the delay circuit 50, a current flows through a path of the resistor R3→the capacitor C7, and the capacitor C7 is charged. When the charging voltage of the capacitor C7 exceeds the threshold voltage of the third switch element Q3, the third switch element Q3 is turned on. With this, the voltage between the gate and the source of the second switch element Q2 drops below the threshold voltage of the second switch element Q2, and the second switch element Q2 is turned off. In other words, the second switch element Q2 is forcibly turned off after the delay time of the delay circuit 50 has elapsed.

It is to be noted that the diode D1 is provided to discharge the capacitor C7 rapidly without delay by conducting during a period in which the output of the snubber driving circuit 61 decreases.

Third Preferred Embodiment

In a third preferred embodiment of the present invention, a switch circuit including an active snubber circuit having a different circuit configuration from that described in the second preferred embodiment will be described.

Figure 6:
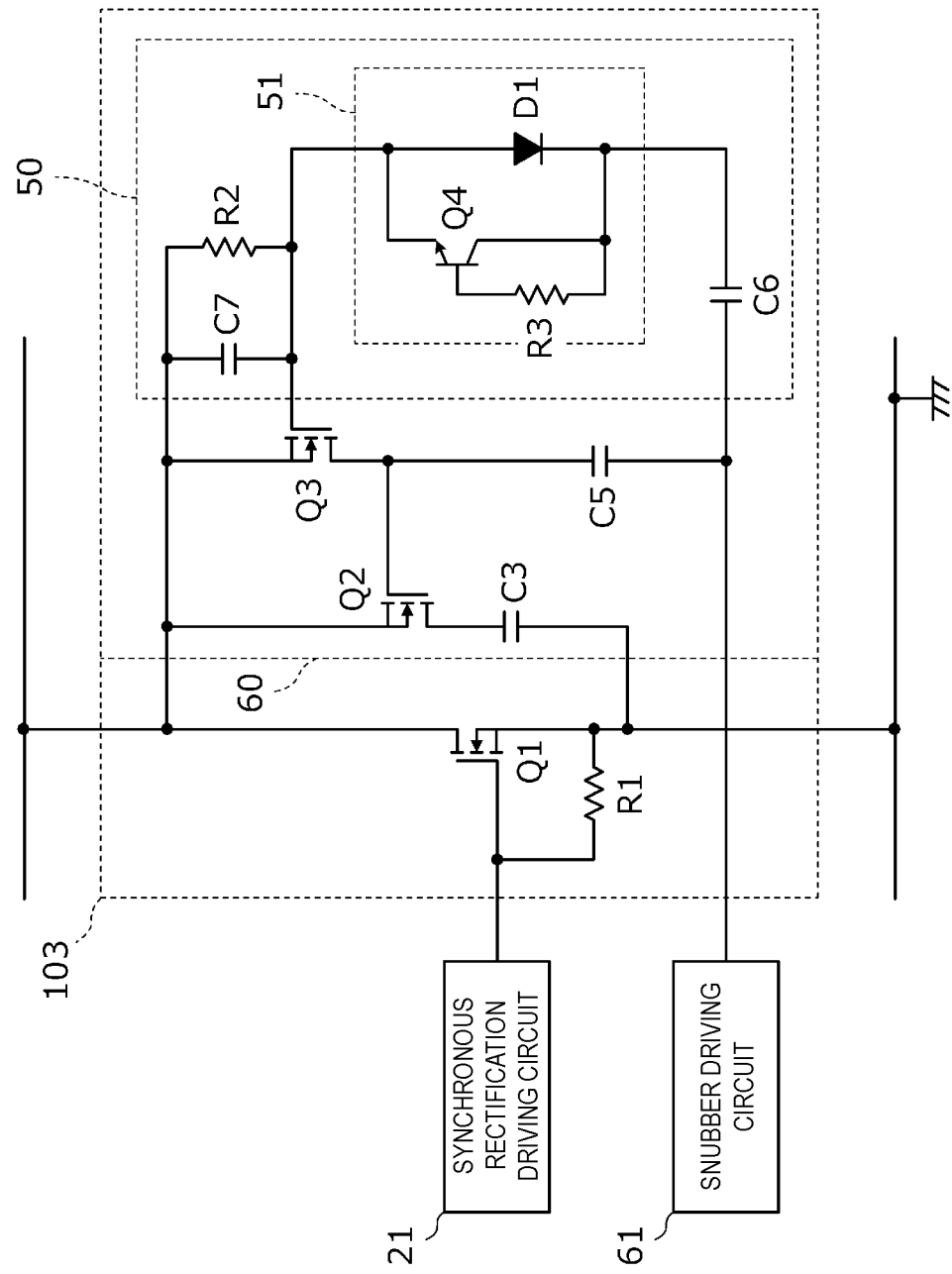
FIG. 6 is a circuit diagram of a switch circuit 103 including an active snubber circuit according to a third preferred embodiment of the present invention.

FIG. 6 is a circuit diagram of a switch circuit 103 including an active snubber circuit according to the third preferred embodiment. The switch circuit 103 including the active snubber circuit is also applied to, for example, the commutation switch element of the DC-DC converter.

The configuration is different from that of the switch circuit 102 including the active snubber circuit illustrated in FIG. 5 in the second preferred embodiment in that a transistor Q4 is provided.

The delay circuit 50 includes the capacitors C6 and C7 and the impedance circuit 51. The impedance circuit 51 includes the resistor R3, the transistor Q4, and the diode D1.

In synchronization with the synchronous rectification driving circuit 21, the snubber driving circuit 61 outputs a predetermined positive voltage at a timing at which the second switch element Q2 for the snubber should be turned on. The output voltage of the snubber driving circuit 61 is applied between the gate and the source of the second switch element Q2 with the capacitor C5 interposed therebetween, and the second switch element Q2 is turned on. With this, the second switch element Q2 and the capacitor C3 define and function as the snubber circuit for the first switch element Q1.

Further, by the output voltage of the snubber driving circuit 61 being applied to the delay circuit 50, a current flows through a path (main path) of the capacitor C6→the transistor Q4→the capacitor C7, and the capacitor C7 is charged. When the charging voltage of the capacitor C7 exceeds the threshold voltage of the third switch element Q3, the third switch element Q3 is turned on. With this, the voltage between the gate and the source of the second switch element Q2 drops below the threshold voltage of the second switch element Q2, and the second switch element Q2 is turned off. In other words, the second switch element Q2 is forcibly turned off after the delay time of the delay circuit 50 has elapsed.

The transistor Q4 and the resistor R3 define a simple constant current circuit. As described above, the delay circuit having the circuit configuration to charge the capacitor with the constant current may be provided. As a result, since the increase of the charging voltage of the capacitor C7 becomes linear, the setting accuracy of the delay time is improved.

Fourth Preferred Embodiment

In a fourth preferred embodiment of the present invention, a switch circuit including an active snubber circuit in which a P-channel MOS-FET is used for the second switch element Q2 and the third switch element Q3 will be described.

Figure 7:
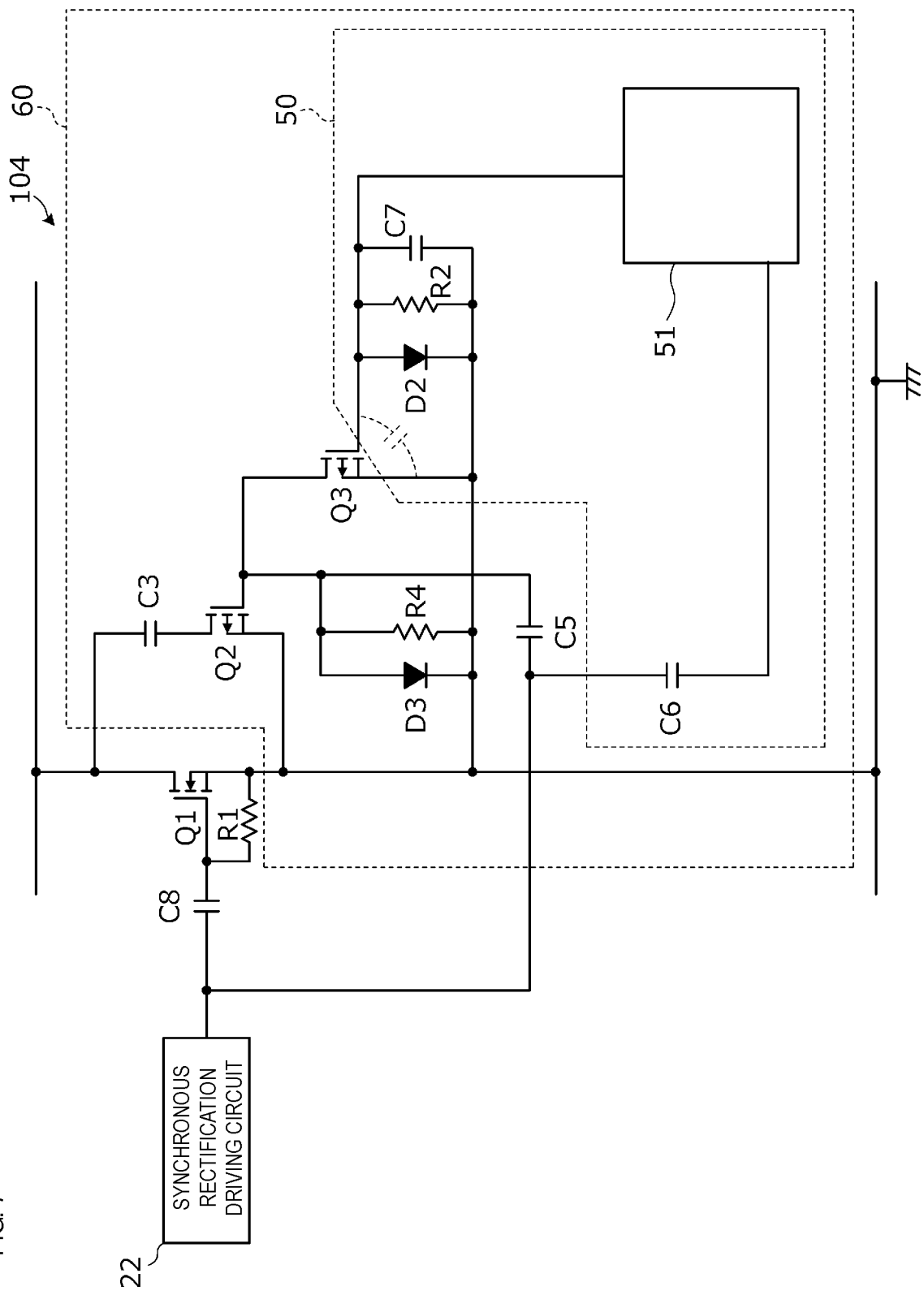
FIG. 7 is a circuit diagram of a switch circuit 104 including an active snubber circuit according to a fourth preferred embodiment of the present invention.

FIG. 7 is a circuit diagram of a switch circuit 104 including an active snubber circuit according to the fourth preferred embodiment. The switch circuit 104 including the active snubber circuit is also applied to, for example, the commutation switch element of the DC-DC converter.

A synchronous rectification driving circuit 22 is connected to the gate of the first switch element Q1 which is the commutation switch element with a capacitor C8 interposed therebetween. Between the drain and the source of the first switch element Q1, the series circuit including the second switch element Q2 and the capacitor C3 for the snubber is connected.

The synchronous rectification driving circuit 22 is connected to the gate of the second switch element Q2 with the capacitor C5 interposed therebetween. The third switch element Q3 is connected between the gate and the source of the second switch element Q2. The delay circuit 50 is connected to the gate of the third switch element Q3.

The delay circuit 50 includes a time constant circuit including the capacitors C6 and C7, capacitance between the gate and the source of the third switch element Q3, and the impedance circuit 51. Of the delay circuit 50, the charging voltage of the capacitor C7 is applied between the gate and the source of the third switch element Q3.

The second switch element Q2, the capacitor C3, the third switch element Q3, and the delay circuit 50 define the active snubber circuit 60.

The synchronous rectification driving circuit 22 outputs a rectangular wave signal. The first switch element Q1 is turned on by a positive voltage output from the synchronous rectification driving circuit 22. The second switch element Q2 is turned on by a negative voltage generated by inverting the positive voltage output from the synchronous rectification driving circuit 22 by the capacitor C5 and a diode D3. Accordingly, the second switch element Q2 and the capacitor C3 define and function as the snubber circuit for the first switch element Q1.

During a period in which the output voltage of the synchronous rectification driving circuit 22 is inverted by the capacitor C6 and a diode D2 and the negative voltage is generated, a current flows through a path of the capacitor C7→the impedance circuit 51→the capacitor C6, and the capacitor C7 is charged with the negative voltage. When the charging voltage of the capacitor C7 exceeds the threshold voltage of the third switch element Q3, the third switch element Q3 is turned on. With this, the voltage between the gate and the source of the second switch element Q2 drops below the threshold voltage of the second switch element Q2, and the second switch element Q2 is turned off. In other words, the second switch element Q2 is forcibly turned off after the delay time of the delay circuit 50 has elapsed.

Note that the diode D2 sets a reverse voltage between the gate and the source of the third switch element Q3 to zero during a period in which the positive voltage is output from the synchronous rectification driving circuit 22.

In the present preferred embodiment, when the first switch element Q1 is an N-channel MOS-FET, and the second switch element Q2 and the third switch element Q3 are the P-channel MOS-FETs, it is not necessary to provide a driving circuit for the first switch element Q1 and a driving circuit for the second switch element Q2 independently, which makes it possible to simplify the circuit.

Figure 8:
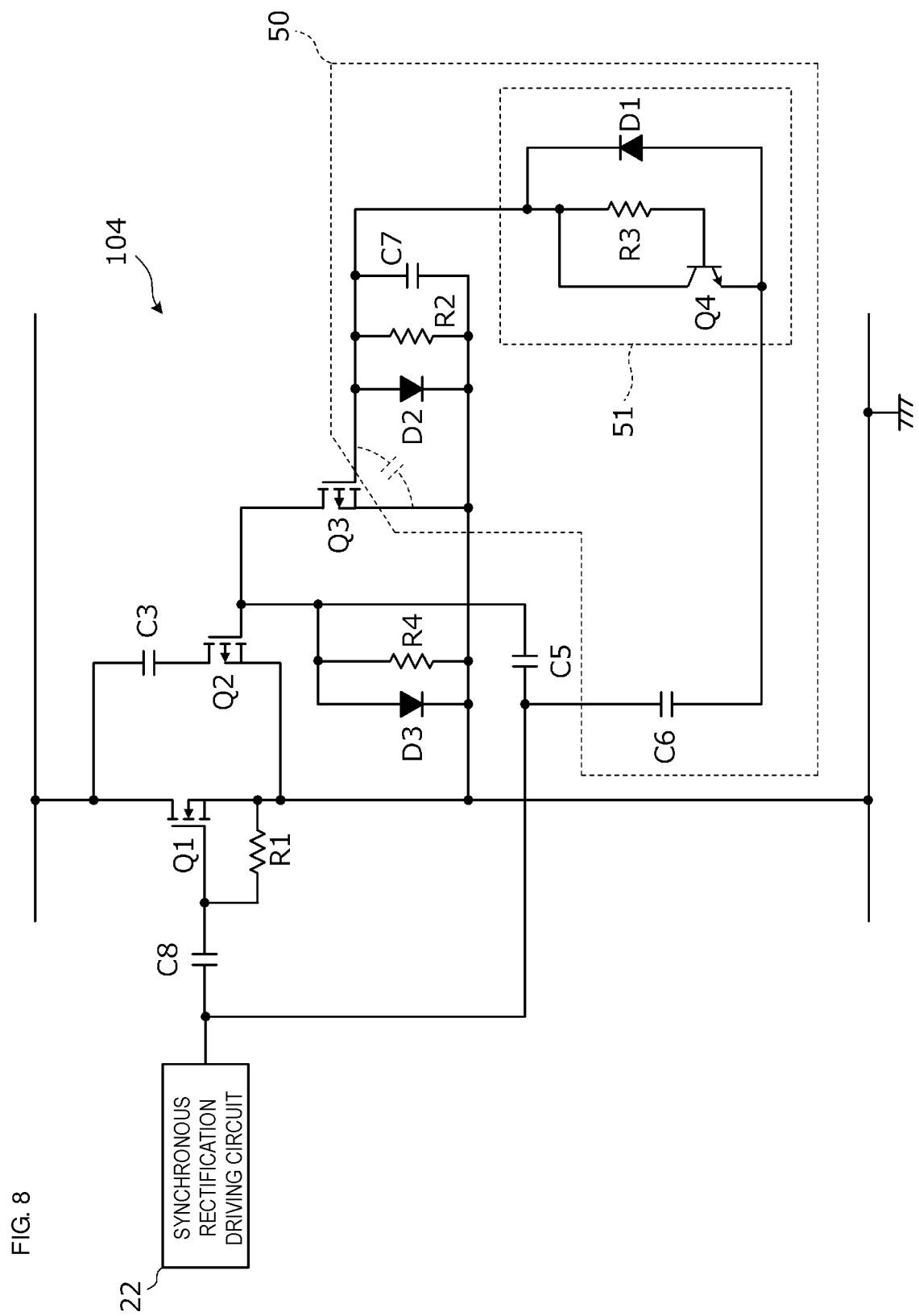
FIG. 8 is a diagram illustrating a specific example of a configuration of an impedance circuit 51 in the circuit diagram of the switch circuit 104 including the active snubber circuit according to the fourth preferred embodiment of the present invention.

FIG. 8 illustrates a specific example of a configuration of the impedance circuit 51 in the circuit diagram of the switch circuit 104 including the active snubber circuit according to the fourth preferred embodiment. In FIG. 8, the transistor Q4 and the resistor R3 define a simple constant current circuit. Additionally, the diode D1 is provided to discharge the capacitor C7 rapidly without delay.

Figure 9:
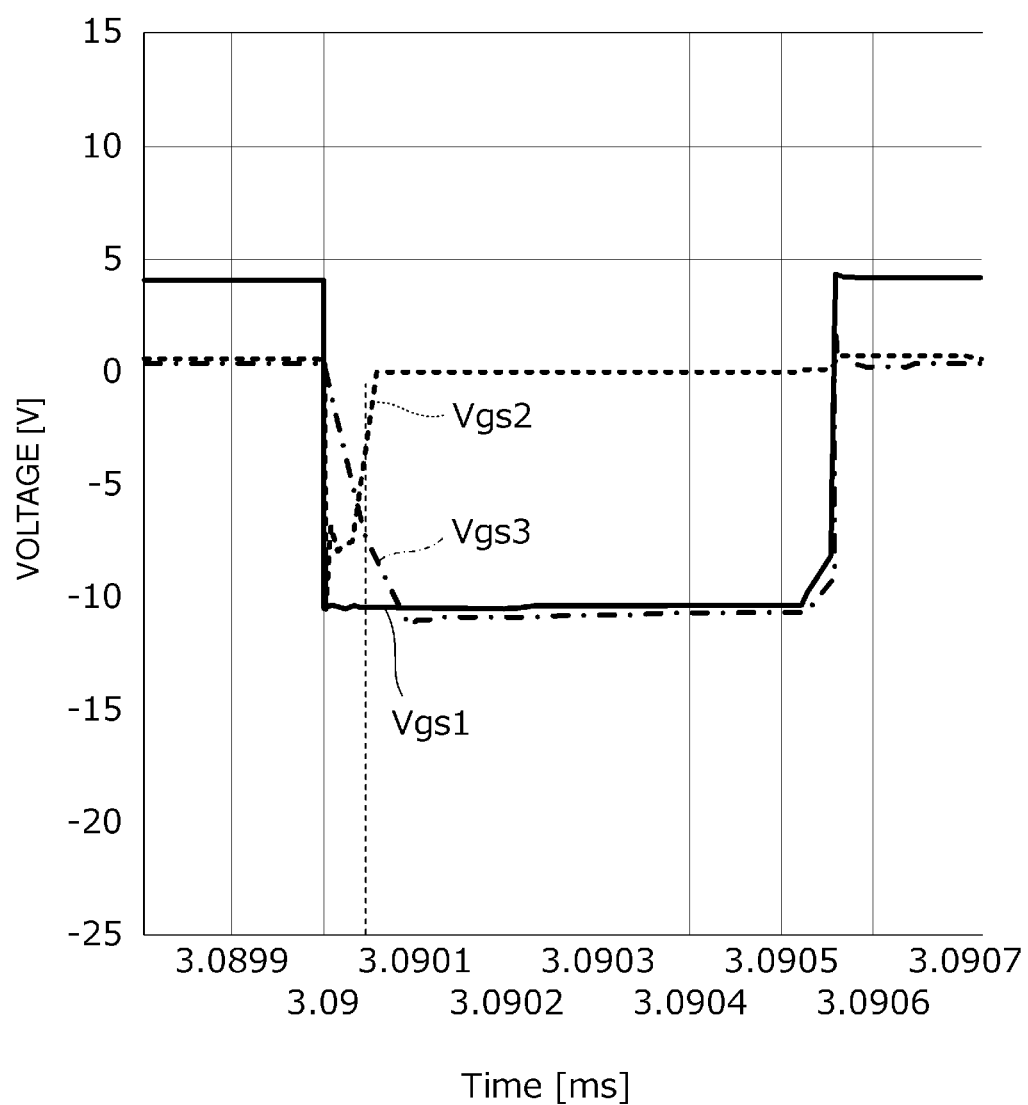
FIG. 9 is a diagram illustrating a voltage waveform of each section in FIG. 8.

FIG. 9 is a diagram illustrating a voltage waveform of each section in FIG. 8. Here, the voltage Vgs1 is the voltage between the gate and the source of the first switch element Q1, the voltage Vgs2 is the voltage between the gate and the source of the second switch element Q2, and the voltage Vgs3 is the voltage between the gate and the source of the third switch element Q3. In this example, the voltage Vgs1 between the gate and the source of the first switch element Q1 drops at a time of about 3.09 ms, for example, and the first switch element Q1 is turned off. At this timing, the voltage Vgs2 between the gate and the source of the second switch element Q2 exceeds the threshold value, and the second switch element Q2 is turned on. Thereafter, at a time of, for example, about 3.09004 ms after the lapse of the delay time of the delay circuit 50, the third switch element Q3 is turned on, and the electric charges of the capacitance between the gate and the source of the second switch element Q2 are extracted. With this configuration, the second switch element Q2 is forcibly turned off.

Fifth Preferred Embodiment

In a fifth preferred embodiment of the present invention, an example will be described in which the active snubber circuit is driven by an output of a secondary winding of a choke transformer provided on a secondary side of the DC-DC converter.

Figure 10:
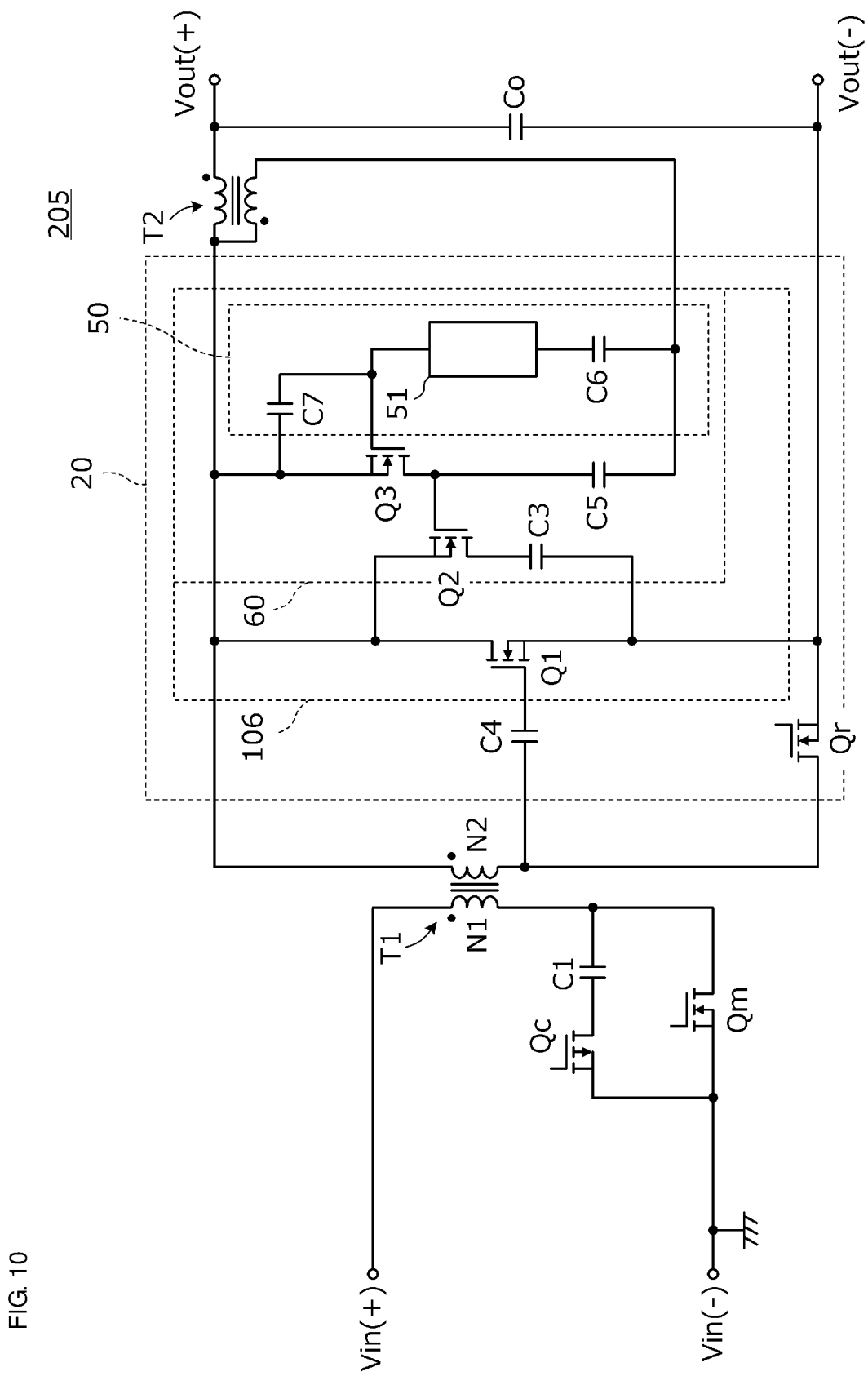
FIG. 10 is a circuit diagram of a DC-DC converter 205 according to a fifth preferred embodiment of the present invention.

FIG. 10 is a circuit diagram of a DC-DC converter 205 according to the fifth preferred embodiment. The DC-DC converter 205 includes the voltage input sections Vin(+) and Vin(−) that receive the DC voltage, and the voltage output sections Vout(+) and Vout(−) to which a load is connected, converts the DC voltage input to the voltage input sections Vin(+) and Vin(−) into a stabilized predetermined DC voltage, and outputs the resulting DC voltage to the load through the voltage output sections Vout(+) and Vout(−). The DC-DC converter 201 includes the transformer T1 including the primary winding N1 and the secondary winding N2. The main switch element Qm is connected between the voltage input sections Vin(+) and Vin(−) and the primary winding N1 of the transformer T1. The rectifier circuit 20 is provided between the voltage output sections Vout(+) and Vout(−) and the secondary winding N2 of the transformer T1.

The rectifier switch element Qr and a primary winding of a choke transformer T2 are connected in series to the secondary winding N2 of the transformer T1. The first switch element Q1 which is the commutation switch element is connected between a connection point of the secondary winding N2 and the primary winding of the choke transformer T2 and the Vout(−) terminal. The rectifier circuit 20 includes the rectifier switch element Qr and the first switch element Q1.

The series circuit including the capacitor C6, the capacitor C7, and the impedance circuit 51 is connected between both ends of a secondary winding of the choke transformer T2. Further, the series circuit including the third switch element Q3 and the capacitor C5 is connected between both ends of the secondary winding of the choke transformer T2, and the connection point between the third switch element Q3 and the capacitor C5 is connected to the gate of the second switch element Q2.

The second switch element Q2, the capacitor C3, the third switch element Q3, the capacitor C5, and the delay circuit 50 define the active snubber circuit 60. Additionally, the active snubber circuit 60 and the first switch element Q1 define a switch circuit 106 including an active snubber circuit. Other configurations are the same or substantially the same as those of the DC-DC converter illustrated in FIG. 1 in the first preferred embodiment.

As described in the present preferred embodiment, the active snubber circuit may be driven by the output of the secondary winding of the choke transformer.

Sixth Preferred Embodiment

In a sixth preferred embodiment of the present invention, a switch circuit including an active snubber circuit including a delay circuit that includes a comparator will be described.

Figure 11:
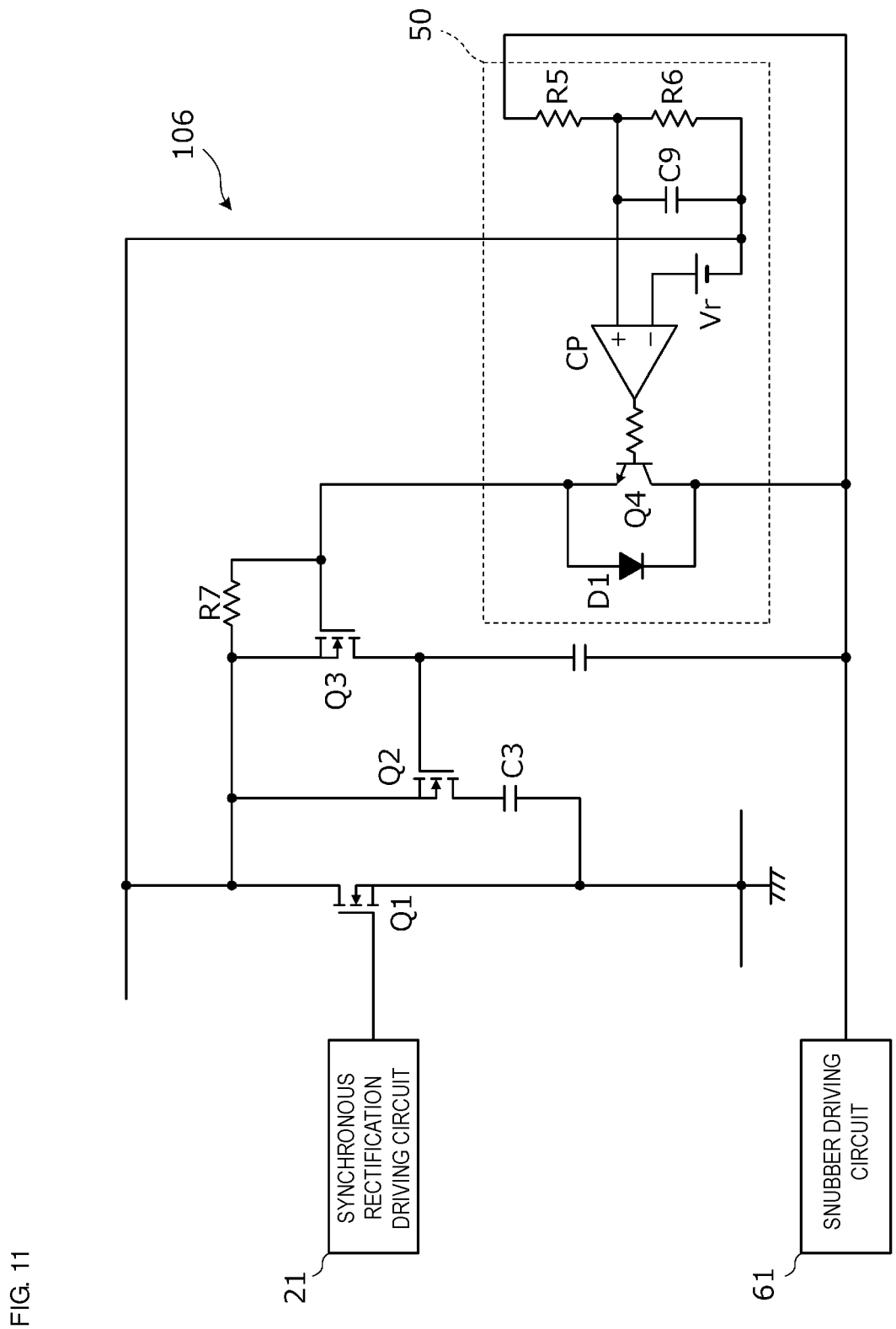
FIG. 11 is a circuit diagram of a switch circuit 106 including an active snubber circuit according to a sixth preferred embodiment of the present invention.
Figure 12:
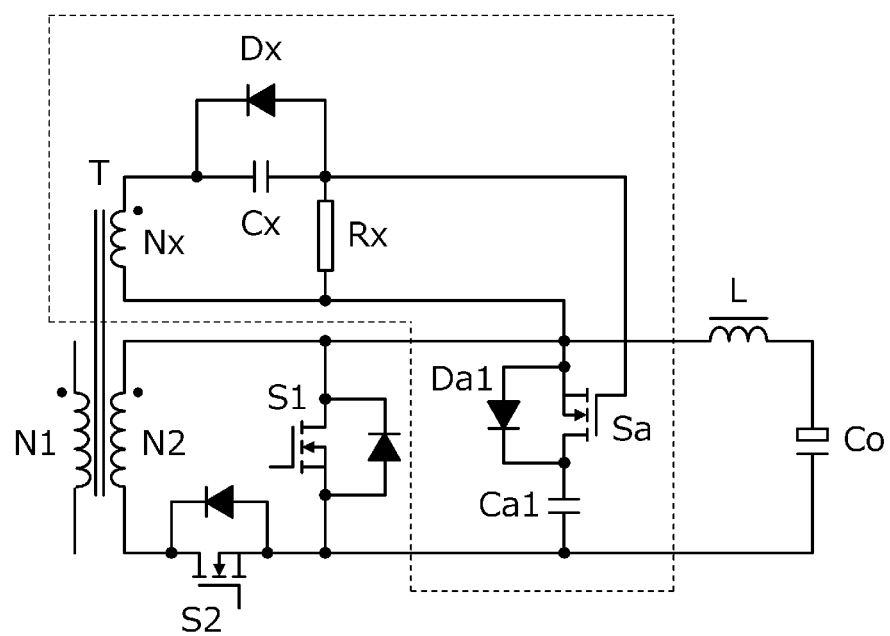
FIG. 12 is a circuit diagram of a main portion of a DC-DC converter including an active snubber circuit disclosed in U.S. Pat. No. 6,771,521.

FIG. 11 is a circuit diagram of the switch circuit 106 including the active snubber circuit according to the sixth preferred embodiment. The switch circuit 106 including the active snubber circuit is also applied to, for example, the commutation switch element of the DC-DC converter.

The synchronous rectification driving circuit 21 is connected to the gate of the first switch element Q1 which is the commutation switch element. Between the drain and the source of the first switch element Q1, the series circuit including the second switch element Q2 and the capacitor C3 for the snubber is connected.

The third switch element Q3 is connected between the gate and the source of the second switch element Q2. The delay circuit 50 is connected to the gate of the third switch element Q3. Further, the source of the third switch element Q3 is grounded, and a resistor R7 is connected between the gate and the source of the third switch element Q3.

The delay circuit 50 includes a time constant circuit including resistors R5 and R6 and a capacitor C9, a comparator CP, and the transistor Q4. A charging voltage of the capacitor C9 and a reference voltage Vr are input to the comparator CP. The transistor Q4 is driven by an output of the comparator CP.

The capacitor C9 is charged with a positive voltage output from the snubber driving circuit 61, and when the voltage exceeds the reference voltage Vr, the output of the comparator CP becomes a high level. With this, the transistor Q4 is turned on and the third switch element Q3 is turned on. With this, the voltage between the gate and the source of the second switch element Q2 drops below the threshold voltage of the second switch element Q2, and the second switch element Q2 is turned off. In other words, the second switch element Q2 is forcibly turned off after the delay time of the delay circuit 50 has elapsed.

It is to be noted that the diode D1 is provided to discharge the capacitor C7 rapidly without delay by conducting during a period in which the output of the snubber driving circuit 61 is extracted.

According to the present preferred embodiment, since the delay time is determined by setting the time constant and the reference voltage, it is possible to increase the degree of freedom in setting and to set the delay time with high accuracy.

Although an example of applying the active snubber circuit to the commutation switch element of the DC-DC converter has been described in the preferred embodiments described above, the present invention is not limited to be applied to the commutation switch element of the DC-DC converter, and may be similarly applied to a switch portion in which the snubber circuit is added in any circuit.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A switch circuit comprising:
 a first switch element defined by an FET; and
 an active snubber circuit connected between a drain and a source of the first switch element; wherein
 the active snubber circuit includes:
  a second switch element defined by an FET;
  a third switch element defined by an FET;
  a capacitor connected in series to the second switch element; and
  a delay circuit connected to the third switch element;
 the third switch element is connected to a gate of the second switch element and is turned on to extract an electric charge of capacitance between the gate and a source of the second switch element; and
 the delay circuit includes a connecting capacitor configured to generate a control terminal voltage for the third switch element, a constant current circuit configured to charge the connecting capacitor, and a diode configured to discharge the connecting capacitor; and
 the delay circuit is configured to turn on the third switch element at a timing delayed from a timing at which the second switch element is turned on.

2. The switch circuit including the active snubber circuit according to claim 1, wherein
the constant current circuit includes a transistor and a first resistor which is connected between a base and a collector of the transistor; and
the diode is connected in parallel between the collector and an emitter of the transistor.

3. The switch circuit including the active snubber circuit according to claim 1, wherein the second switch element and the capacitor define a series circuit that is connected between the drain and the source of the first switch element.

4. The switch circuit including the active snubber circuit according to claim 1, wherein a second resistor is connected between a gate and the source of the first switch element.

5. The switch circuit including the active snubber circuit according to claim 1, further comprising a snubber driving circuit connected to the gate of the second switch element.

6. The switch circuit including the active snubber circuit according to claim 1, wherein the third switch element is connected between the gate and a source of the second switch element.

7. The switch circuit including the active snubber circuit according to claim 1, further comprising a delay circuit connected to a gate of the third switch element.

8. The switch circuit including the active snubber circuit according to claim 1, wherein the second switch element is defined by a P-channel MOS-FET.

9. The switch circuit including the active snubber circuit according to claim 1, wherein the third switch element is defined by a P-channel MOS-FET.

10. A DC-DC converter comprising:
the switch circuit including the active snubber circuit according to claim 1;
a voltage input section that receives a DC voltage;
a voltage output section to which a load is connected;
a transformer including a primary winding and a secondary winding;
a main switch element provided between the voltage input section and the primary winding of the transformer; and
a synchronous rectifier circuit including the active snubber circuit and provided between the voltage output section and the secondary winding of the transformer.

11. The DC-DC converter according to claim 10, wherein the transformer further includes an auxiliary winding; and
a voltage of the auxiliary winding of the transformer is input to the delay circuit and the third switch element is turned off.

12. The DC-DC converter according to claim 10, further comprising a clamp circuit including a clamp switch element and a clamp capacitor provided between the voltage output section and the secondary winding of the transformer.

13. The DC-DC converter according to claim 10, wherein
the constant current circuit includes a transistor and a first resistor which is connected between a base and a collector of the transistor; and
the diode is connected in parallel between the collector and an emitter of the transistor.

14. The DC-DC converter according to claim 10, wherein the second switch element and the capacitor define a series circuit that is connected between the drain and the source of the first switch element.

15. The DC-DC converter according to claim 10, wherein a second resistor is connected between a gate and the source of the first switch element.

16. The DC-DC converter according to claim 10, further comprising a snubber driving circuit connected to the gate of the second switch element.

17. The DC-DC converter according to claim 10, wherein the third switch element is connected between the gate and a source of the second switch element.

18. The DC-DC converter according to claim 10, further comprising a delay circuit connected to a gate of the third switch element.

19. The DC-DC converter according to claim 10, wherein the second switch element is defined by a P-channel MOS-FET.

20. The DC-DC converter according to claim 10, wherein the third switch element is defined by a P-channel MOS-FET.

* * * * *